United States Patent
Heithoff

(12) 
(10) Patent No.: US 6,404,372 B1
(45) Date of Patent: Jun. 11, 2002

(54) ASYNCHRONOUS A/D CONVERTER WITH MOVING WINDOW

(75) Inventor: Christopher Bernard Heithoff, Saratoga, CA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 09/636,110

(22) Filed: Aug. 10, 2000

(51) Int. Cl.[7] ................................................ H03M 1/12

(52) U.S. Cl. ....................... 341/155; 341/158; 341/164; 341/115

(58) Field of Search ................................ 341/155, 165, 341/158, 164, 115, 163

(56) References Cited

U.S. PATENT DOCUMENTS 4,160,243 A * 7/1979 Noriya et al. ................ 340/347
5,515,050 A * 5/1996 Luedtke ........................ 341/163

* cited by examiner

Primary Examiner—Michael Tokar
Assistant Examiner—Lam T. Mai
(74) Attorney, Agent, or Firm—Merchant & Gould P.C.; Timothy P. Sullivan

(57) ABSTRACT

An A/D converter has been described that compares the bounds of a voltage window with an analog input signal $V_{in}$. When $V_{in}$ is not within the boundaries of the voltage window, the position of the voltage window is moved either upwards or downwards depending on the disposition of the analog input signal. The position of the voltage window is sequentially moved until either the analog signal $V_{in}$ is within the bounds of the window or the absolute upper or lower position limits are reached.

20 Claims, 6 Drawing Sheets

ASYNCHRONOUS A/D CONVERTER WITH MOVING WINDOW

FIELD OF THE INVENTION

The present invention pertains generally to electronic circuits, and more specifically to analog-to-digital (A/D) converters.

BACKGROUND OF THE INVENTION

A converter is an electronic component (often a single chip) employed in an electronic circuit to perform conversions between analog signals and digital data. An analog-to-digital (A/D) converter is used to change an analog signal into digital data having a direct correspondence to the value of the analog signal. Similarly, a digital-to-analog (D/A) converter converts an input of digital data into a corresponding analog signal. Both A/D and D/A converters are used in many types of electronic circuits/devices. For example, an A/D converter is employed in a digital phone to convert a human voice (an analog signal) into digital data that can be transmitted over a digital network. Also, a D/A converter is often used in a modem to convert digital data from a computer into an analog signal suitable for transmission over a non-digital network such as a plain old telephone system (POTS).

Typically, when an A/D converter receives an analog voltage signal at its input, this signal is converted into digital data that includes a binary representation of the level of the signal at the input. The digital data outputted by an A/D converter usually includes a digital word "d" that has n-bits of resolution, where $d = b_1/2^1 + b_2/2^2 + \ldots + b_n/2^n$, and where $b_1, b_2, \ldots, b_n$ are binary bit coefficients having either a one or a zero value. These bit coefficients are used to create the digital word "d" that is presented at the output of the A/D converter. A parallel A/D converter presents all of the bit coefficients simultaneously at the output and a serial A/D converter provides the bit coefficients serially, i.e., one bit coefficient at a time, at the output.

The digital word output of an A/D converter is only an approximation of an actual analog signal received by the converter. Often, in order to approximate an analog signal more completely, a digital word will be created with a most significant bit (MSB) coefficient and a least significant bit (LSB) coefficient. Ideally, the actual value of an analog data signal will be within +or −½the LSB of the digital word.

There are many problems that can cause an A/D converter to create a relatively inaccurate digital representation of an analog signal input, including: offset error, scale error, nonlinearity, nonmonotonicity and incorrect latching. It is envisioned that a new design for an A/D converter would help to solve these common problems and would also consider many different factors, including among others, accuracy, sampling rate, throughput rate and cost.

SUMMARY OF THE INVENTION

The present invention is directed at addressing the above-mentioned shortcomings, disadvantages and problems, and will be understood by reading and studying the following specifications.

The apparatus and methods described herein convert an analog signal into a digital output. A generator is employed to generate a top voltage boundary and a bottom voltage boundary for a voltage window. A comparator is used to compare the analog input to the top voltage boundary and the bottom voltage boundary for the voltage window. The comparator sets an off state when the analog signal is positioned above the bottom voltage boundary and below the top voltage boundary. The comparator sets an on state when the bottom voltage boundary is greater than the analog input and sets another on state when the top voltage is less than the analog input. Also, a counter is used to increment a digital output when the comparator is in the on state and decrement the digital output when the comparator is in the other on state. The digital output of the counter is latched and represents the value of the analog signal when the comparator is in the off state.

Another aspect of the invention includes an oscillator that generates a control signal that controls the speed that the counter will increment and decrement the digital output. The oscillator is disabled when the comparator is in the off state so that power consumption is reduced. Also, the speed of the counter is slower than the speed that the comparator requires for comparing the analog input to the top voltage boundary and the bottom voltage boundary and setting the state of the comparator in accordance with these comparisons.

Yet another aspect of the invention includes a feed back loop that provides the digital output of the counter to the generator. Also, the top voltage boundary and the bottom voltage boundary are equivalently increased when the counter increments the digital output and equivalently decreased when the counter decrements the digital output. The feedback loop adjusts the position of the voltage window until the original analog signal is within the bounds of the window.

Still another aspect of the invention includes a new voltage window that is generated at a higher position when the counter is incremented and another new voltage window is generated at a lower position when the counter is decremented. A distance between an initial position of the voltage window and the higher position for the new voltage window and another distance between the initial position of the voltage window and the lower position for the other new voltage window being less than the height of each voltage window so that hysteresis is created by the overlap between the bounds of consecutively generated voltage windows. For example, each voltage window could be created 150 milli-Volts wide and positioned 100 milliVolts higher than the previous voltage window so that the "extra" 50 milliVolts creates hysteresis between each consecutive window.

Another aspect of the invention includes setting the distance between consecutive voltage windows to be proportional to a constant multiplier of the least significant bit (LSB) of the digital output and less than the height of the adjacent voltage window. Also, an absolute upper limit may be set for incrementing the top voltage boundary and an absolute lower limit can be set for decrementing the bottom voltage boundary for the voltage window.

Yet another aspect of the invention includes a plurality of current sources arranged in an array for the generator. Each current source being separately controlled by a particular bit in the digital output of the counter. The generator including a resistive ladder that is coupled to a plurality of switches that are separately coupled to a corresponding current source in the array. The type of the plurality of switches include an electronic switch and relay. The current sources can be matched or scaled.

Another aspect of the invention includes an n-bit counter that is activated when the analog input to the analog digital device is outside the moving signal window. Another aspect of the invention limits the speed of the n-bit counter in order to stabilize the feedback loop. The n-bit counter only makes one step during the time necessary for the comparators to respond. This moves the voltage window up or down one unit. The voltage window continues moving until the comparators indicate that the analog input is within the window generated, or until the voltage window is at an endpoint. If the window is at the high or low position, the window is reset.

DETAILED DESCRIPTION OF THE PREFERRED EMBODIMENT

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Figure 1:
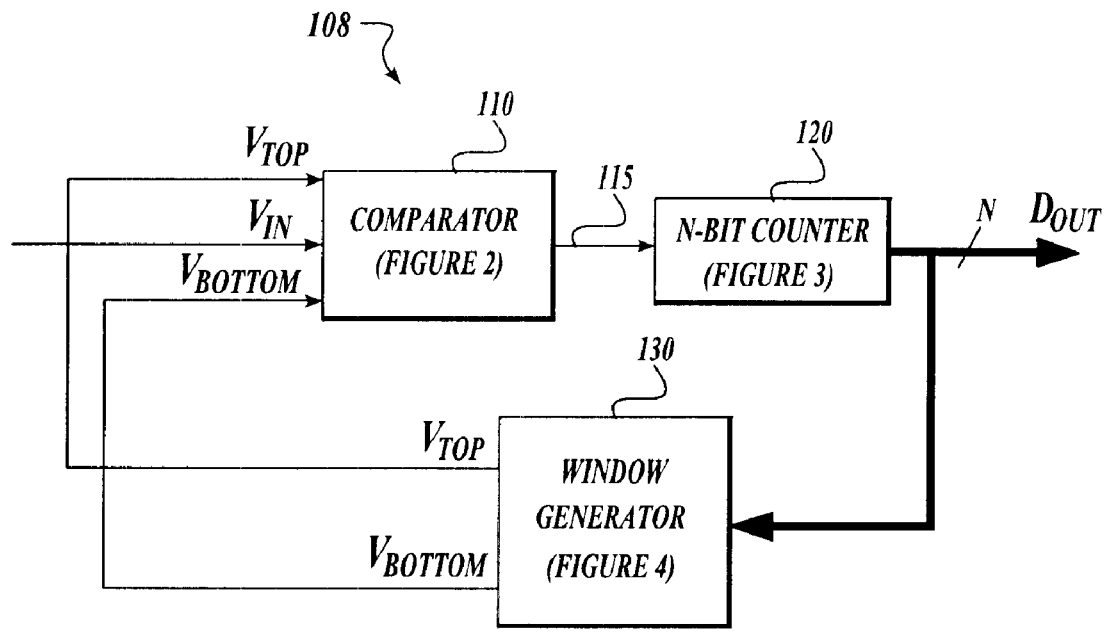
FIG. 1 is a schematic overview of an A/D circuit according to one embodiment of the present invention.

FIG. 1 shows a system level overview of an analog-to-digital (A/D) conversion circuit 108 according to one embodiment of the present invention. The circuit 108 employs a feedback loop to adjust (move) a voltage signal window created by a window generator 130 until the original analog voltage signal inputted to the circuit 108 is within the bounds (top and bottom) of the voltage signal window. In one embodiment of the invention, the window generator 130 includes a D/A converter that outputs a top voltage level ($V_{top}$) and a bottom voltage level ($V_{bottom}$) for the voltage signal window. In one embodiment of the invention, $V_{top}$ and $V_{bottom}$ are separated by a voltage difference equivalent to a desired least significant bits of resolution. Also, since the two voltage levels ($V_{top}$ and $V_{bottom}$) outputted by the window generator 130 are adjustable, the voltage signal window can be moved as necessary to include the original analog voltage signal input within the top and bottom bounds of the window.

A comparator 110 receives an analog input signal $V_{in}$ that is compared to $V_{top}$ and $V_{bottom}$. If $V_{in}$ is within the bounds of the movable voltage signal window, an output 115 is set low; otherwise, the output 115 is set high. When the output 115 is set high, an n-bit counter 120 is incremented or decremented depending upon whether $V_{in}$ is below or above the bounds of the movable voltage signal window. Window generator 130 receives the digital word outputted by the n-bit counter 120 and generates the two voltages ($V_{top}$ and $V_{bottom}$) that form the bounds of the movable voltage signal window. The window generator 130 employs the information included in the digital word outputted by the n-bit counter 120 to create the voltage levels ($V_{top}$ and $V_{bottom}$) that define the bounds of the movable voltage signal window. When $V_{in}$ is within the bounds of the voltage window, the A/D conversion is complete, i.e., the digital word outputted by the n-bit counter 120 is latched and outputted by the A/D circuit 108.

The n-bit counter 120 only runs when the analog signal input to the present invention is determined to be outside the voltage window. The speed of the n-bit counter is limited to stabilize the feedback loop to the window generator 130. It is envisioned that the counter 120 will make no more than one step during the time necessary for the comparator components to respond.

When the present invention employs an n-bit counter with an internal clock to count either up or down, this internal clock and the count direction can be enabled by the output of the comparator. The position of the voltage window will increment or decrement (up/down) based upon the results of the comparator or until the window is at either the top window limit or the bottom window limit.

Figure 2:
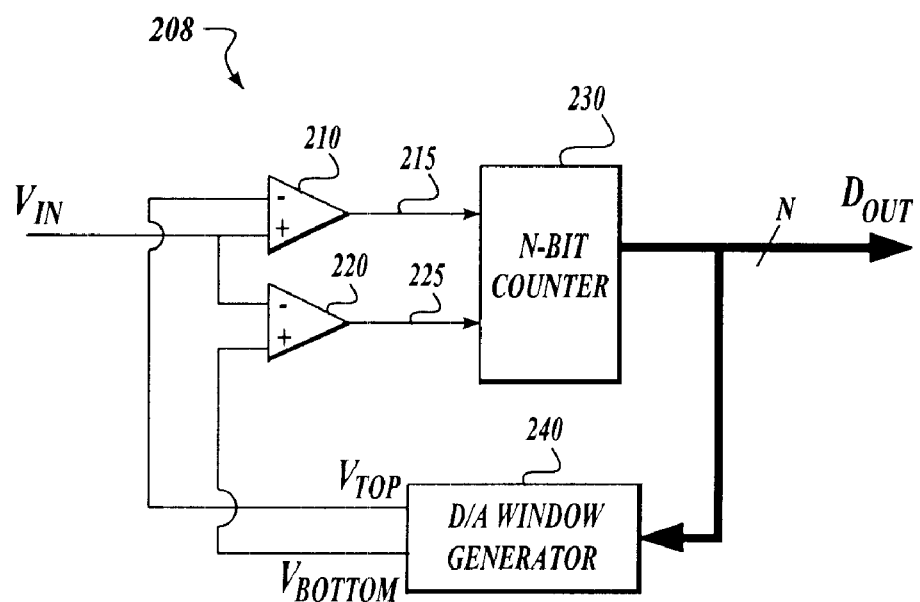
FIG. 2 is a schematic diagram illustrating a comparator circuit in one embodiment of the invention.

FIG. 2 illustrates an A/D circuit 208 with greater detail regarding the comparator functionality of the present invention. $V_{in}$ is coupled to a non-inverting input of a high window comparator 210 and $V_{top}$ is coupled to the inverting input of the comparator 210. When the comparator 210 determines $V_{in}$ to be greater than $V_{top}$, a high output 215 of the comparator is set high which is coupled to an input of an n-bit counter 230. Also, when the comparator 210 determines $V_{in}$ to be less than $V_{top}$, the high output 215 of the comparator is set low.

$V_{in}$ is coupled to an inverting input of a low window comparator 220 and $V_{bottom}$ is coupled to a non-inverting input of the comparator 220. When the comparator 220 determines $V_{in}$ is less than $V_{bottom}$, a low output 225 is set high which is coupled to an input of the n-bit counter 230. Also, when the comparator 220 determines $V_{in}$ to be less than $V_{bottom}$, the low output 225 is set low.

One output of a D/A window generator 240 is $V_{top}$, the other output of the generator is $V_{bottom}$ and the output of the n-bit counter 230 is coupled to an input of the generator. When either the high output 215 of comparator 210 or the low output 225 of comparator 220 is set high, the n-bit counter 230 is activated. So long as either the high output 215 or the low output 225 is set high, the D/A window generator 240 will adjust (move) the voltage level bounds ($V_{top}$ and $V_{bottom}$) for the voltage signal window in accordance with the information included in the digital word outputted by the n-bit counter 120. Alternatively, when both the outputs 215 and 225 are set low, the digital word produced by the n-bit counter 230 is latched and outputted by the circuit 208.

Figure 3:
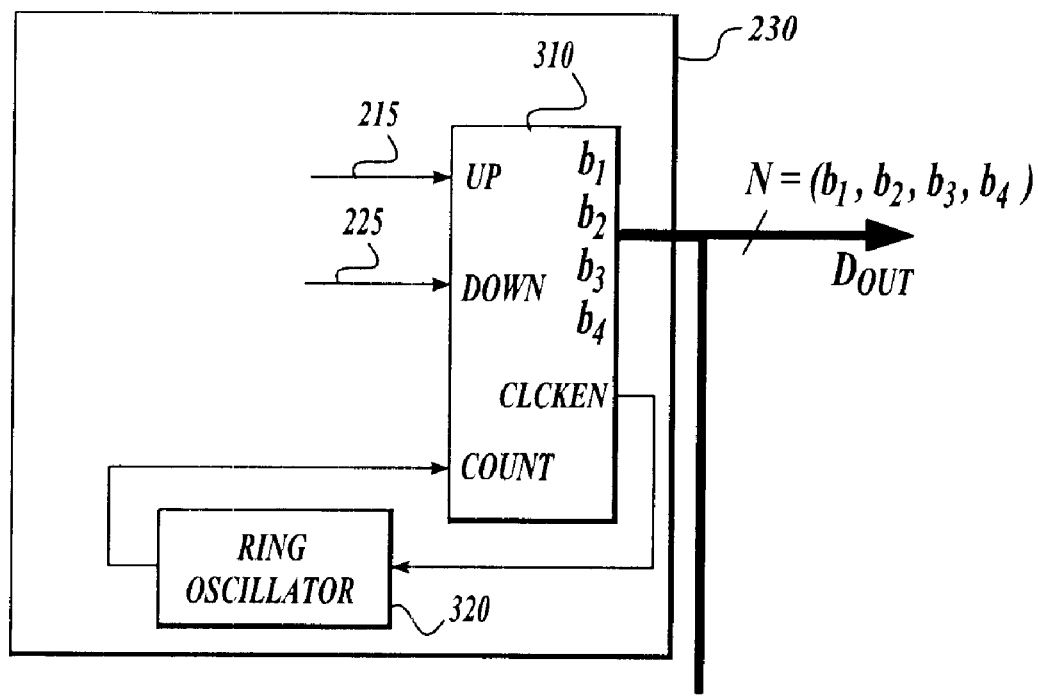
FIG. 3 is a schematic diagram illustrating an n-bit counter according to embodiment of the invention.

FIG. 3 illustrates greater detail regarding the n-bit counter 230 discussed above for one embodiment of the present invention. In an exemplary embodiment, the n-bit counter 230 includes two components a 4-bit counter 310 and a ring oscillator 320. As will be appreciated by those of ordinary skill in the art, the counter 310 is not limited to only 4-bits, but could have a greater or less number of bits, e.g., 2-bit, 8-bit and 16-bit.

An up input of the counter 310 is coupled to the high output 215 of comparator 210 shown in FIG. 2 and a down input is coupled to the low output 225 of comparator 220 illustrated in FIG. 2. When the high output 215 is set high, the up input of the counter 310 is also goes high. If the up input of the counter 310 is set high, the counter 310 counts up one increment when the n-bit counter 230 is activated. Alternatively, when the low output 225 is set high, the down input of the counter 310 is also set low. If the down input of the counter 310 is set low, the counter will count down one increment when n-bit counter 230 is activated. The counter 310 is activated when the up input of the counter is set high or the down input of the counter is set low and the count input of the counter is enabled. When the 4-bit counter 310 is activated, it outputs a digital word "n" that includes four binary bits, i.e., $b_1$, $b_2$, $b_3$ and $b_4$.

An output of a ring oscillator 320 is coupled to the count input of the counter 310 and the CLCKEN output of the counter is coupled to an input of the oscillator 320. Because the output of the ring oscillator 320 sets the count input of the counter 310 to high, the oscillations of the oscillator will control the speed of counting by the counter. The speed of the counter 310 is controlled such that the counter counts slower than the compare speed of the high comparator 210 and the low comparator 220 illustrated in FIG. 2. In this way, the counter 310 will not count before the comparators 210 and 220 have compared their inputs and set their respective outputs 215 and 225. When the ring oscillator 320 sets the count input of the counter 310 to high, the counter 310 is enabled to count either up or down in accordance with the operation of the low output 215 and the high output 225.

Figure 4:
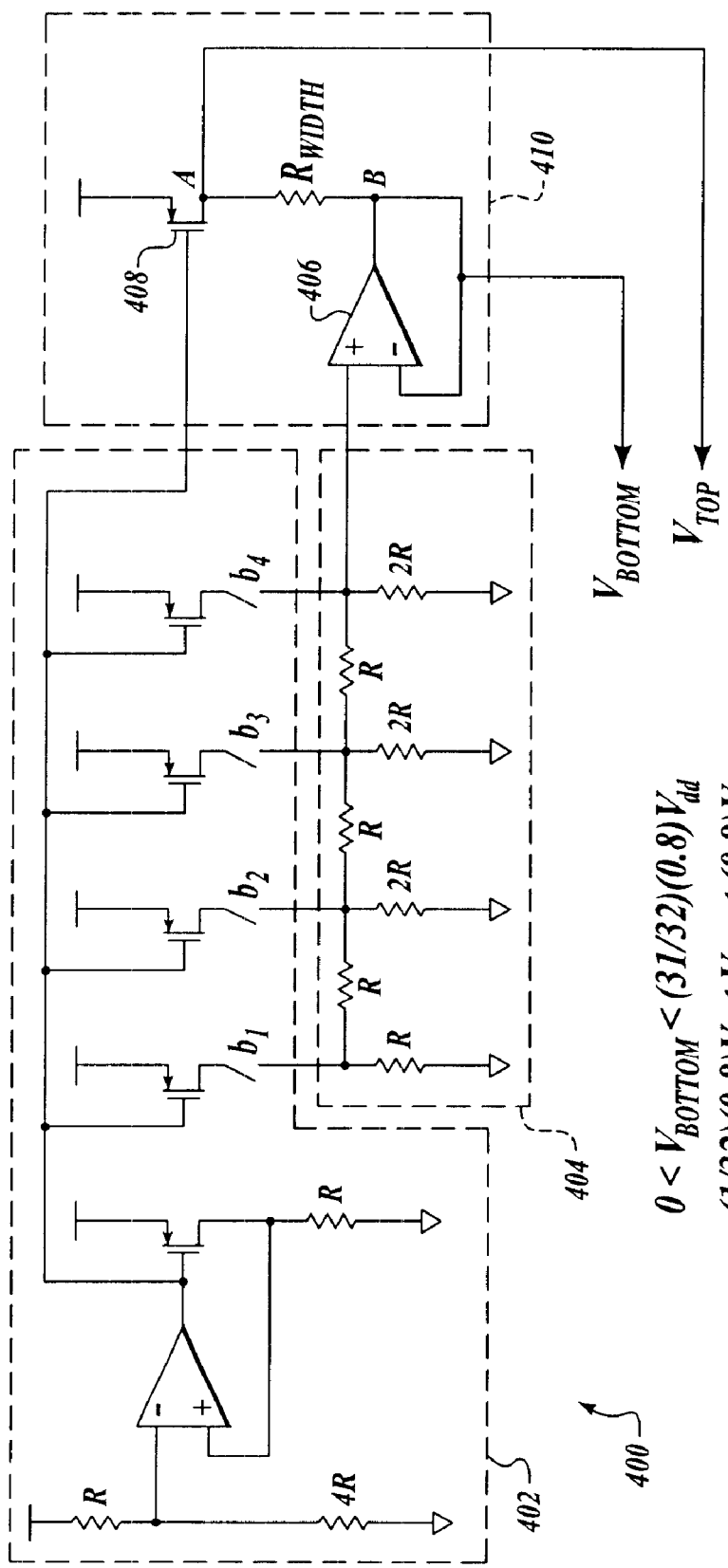
FIG. 4 is a schematic diagram illustrating a voltage signal window generator circuit according to one embodiment of the invention.

FIG. 4 shows a schematic view of several electronic components included in an exemplary window generator 400. An array 402 represents four independently switchable current sources that are coupled to separate nodes in an R/2R resistive ladder network 404. Each current source is separately switched "off" and "on" by an electronic switch which is separately coupled to and controlled by a particular binary bit ($b_1$, $b_2$, $b_3$ or $b_4$) in the digital word "n" outputted by a 4-bit counter shown in FIG. 3. In another embodiment, the operation of the electronic switch may also be performed by a relay. It is also envisioned that the current provided by each current source in the array 402 could be matched, scaled or some combination of the two.

In the exemplary embodiment, the number of current sources in the array 402 are equal to the number of bits in the digital word. As discussed here and above, the actual operation of each electronic switch for each current source is controlled by the state of each corresponding bit in the digital word outputted by the 4-bit counter 310 shown in FIG. 3.

Each electronic switch is also coupled to a particular node/rung in a "R/2R" resistive ladder 404. In this way, when a bit in the digital word is in the "on" state, a corresponding electronic switch closes and current flows from the current source into a node/rung in the resistive ladder 404. These currents cause a voltage drop across the ladder 404 that is presented to a non-inverting input of an opamp 406 in a conversion stage 410. The output of the opamp 406 is directly connected by a feedback loop to the opamp's inverting input. The output of the opamp 406 is also coupled at Node B to an end of a resistor ($R_{width}$) and the bottom voltage level output ($V_{bottom}$) of the window generator 400; the other end of the resistor is connected at Node A to a drain of a conducting MOSFET 408 (current source) and the top voltage level output ($V_{top}$) of the window generator 400. Thus, the voltage drop across the resistor $R_{width}$ at Nodes A and B determines the width of the voltage signal window produced by the generator 400. It is envisioned that the width of the voltage signal window can be varied by switching/changing the resistance value of the resistor $R_{width}$. The top voltage $V_{top}$ is set by the value of the resistor $R_{width}$ and the offset, i.e., the bottom voltage $V_{bottom}$, is set based on the values of the resistor $R_{width}$, and $V_{top}$. In one embodiment of the invention, the offset is set equal to the value of the LSB of the digital word supplied by the n-bit counter.

In one embodiment of the present invention, $V_{top}$ and $V_{bottom}$ may be separated by the voltage equivalent to the desired least significant bit. By controlling/changing the value of $R_{width}$ the voltage signal window may be spaced/positioned as desired. As will be appreciated by those of ordinary skill in the art, the window voltages $V_{top}$ and $V_{bottom}$ may be separated by an amount greater than or equal to the least significant bit.

Figure 5:
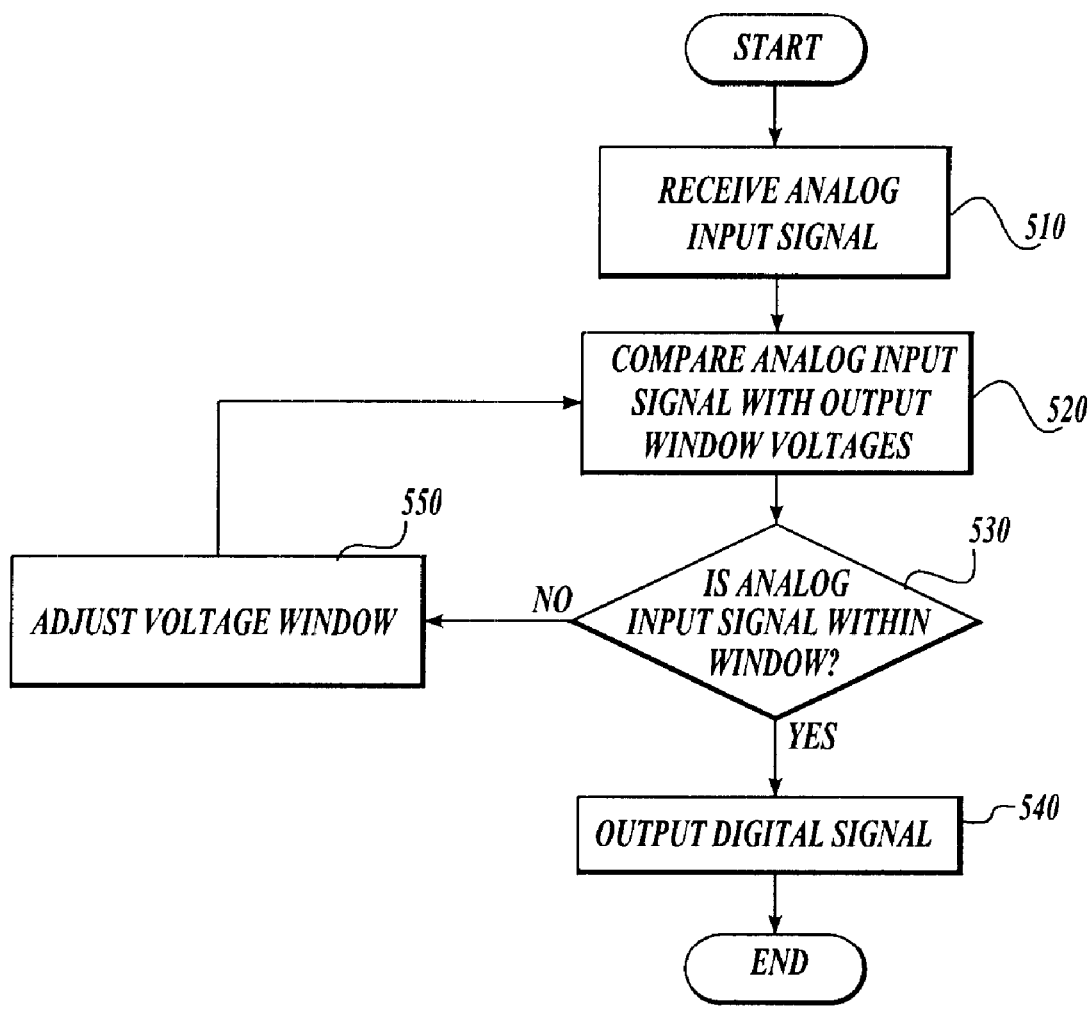
FIG. 5 is an operational flow diagram illustrating the operation of an A/D converter according to one embodiment of the present invention.

FIG. 5 is an operational flow diagram illustrating the operation of an A/D converter according to one embodiment of the present invention. A receive operation 510 receives an analog input signal. In one embodiment of the invention, the analog input signal is an input voltage. A compare operation 520 compares the analog input signal with the top and bottom of the generated movable voltage signal window. In one embodiment of the invention, the compare operation 520 compares an analog input voltage with the output window voltages generated by a movable signal window generator. A decision block 530 determines if the analog input signal is within the bounds of the movable voltage signal window. If so, a digital output representing the analog input signal is provided by an output operation 540, otherwise, the movable voltage signal window is adjusted by an adjust operation 550 (see discussion above and below regarding moving the bounds of the voltage signal window).

Figure 6:
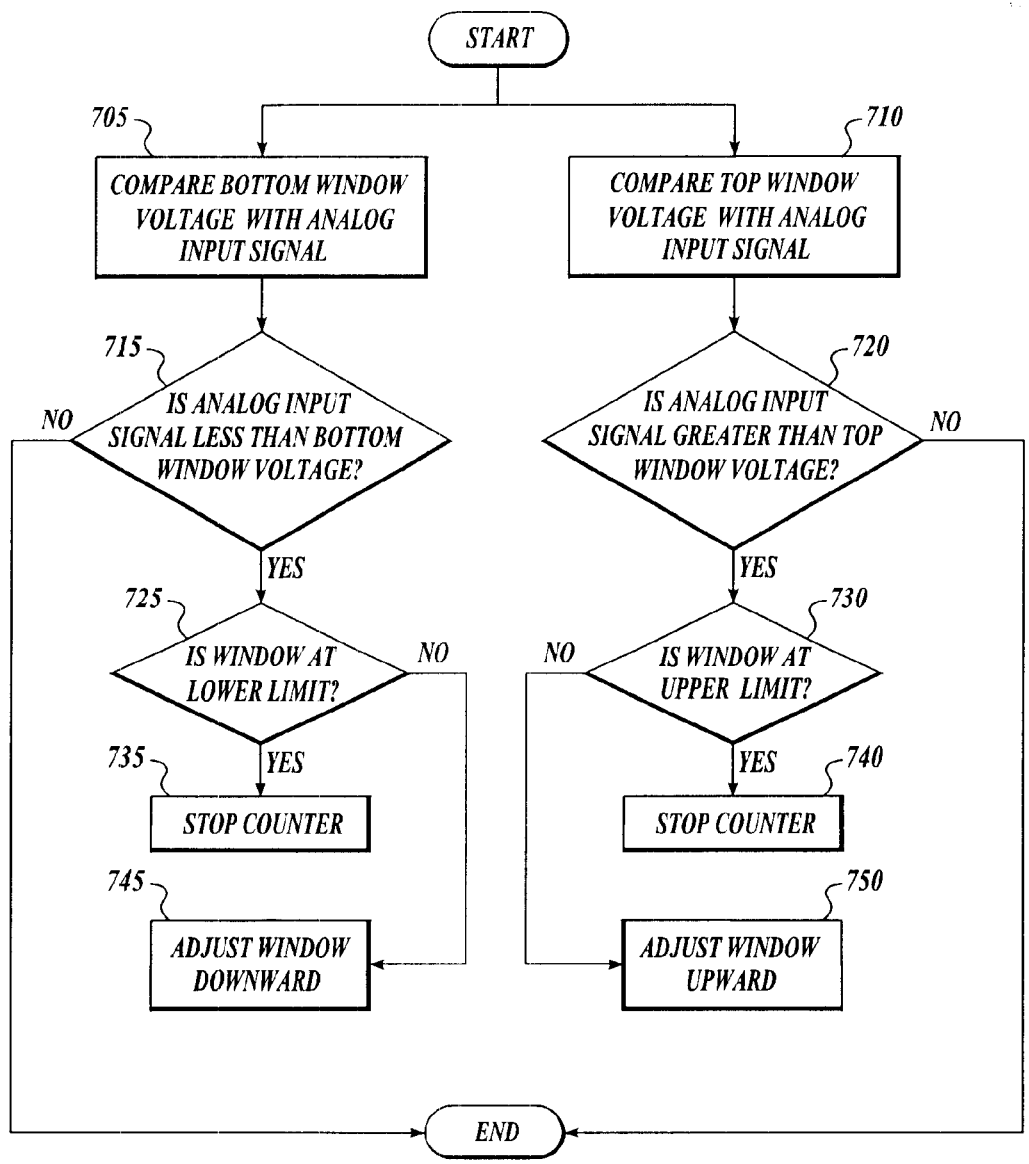
FIG. 6 is an operational flow diagram illustrating the adjustment of the bounds of a voltage signal window.

FIG. 6 is a flow chart illustrating an operational flow for adjusting the bounds of the voltage levels for the movable voltage signal window in one embodiment of the invention. A bottom compare operation 705 compares the bottom voltage window level with the analog input signal. A decision operation 715 determines if the analog input signal is less than the bottom voltage window level. When the bottom voltage window level is determined to be less than the analog input signal, a decision operation 725 determines if the bottom boundary of the voltage window is at a lower voltage limit. If so, a stop counter operation 735 stops further downward adjustment of the window. Otherwise, downward adjust operation 745 adjusts the bounds of the window downward.

Similarly, top compare operation 710 compares the top window voltage with the analog input signal.

A decision operation 720 determines if the analog input signal is greater than the top window voltage. If so, a decision operation 730 determines if the top boundary of the window is at an upper voltage limit. If so, a stop counter operation 740 stops further upward adjustment of the window. Otherwise, the window is adjusted upward by an adjust upward operation 750.

Alternatively, if the operation 705 determined that the analog input signal was not less than the bottom window voltage or the operation 710 determined that the analog input signal was not greater than the top window voltage, the logic flow would return to processing other operations.

Figure 7A:
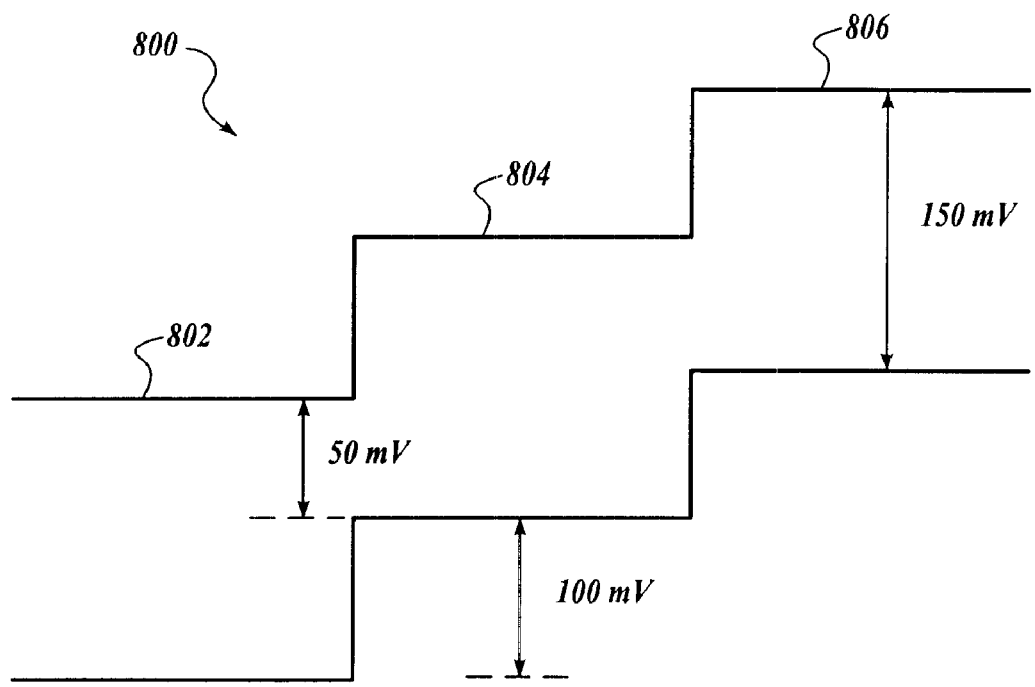
FIG. 7A is a diagram showing the overlap between voltage signal windows generated by the present invention.

FIG. 7A illustrates an overview 800 of the voltage levels of three consecutive voltage signal windows 802, 804 and 806. Each successive window has a width of 150 milliVolts (1.5 LSB) and is set 100 milliVolts (1.0 LSB) higher than the previous window where 1.0 LSB is equal to 100 milliVolts. In this way, each successive window overlaps and provides hysteresis for the present invention.

Figure 7B:
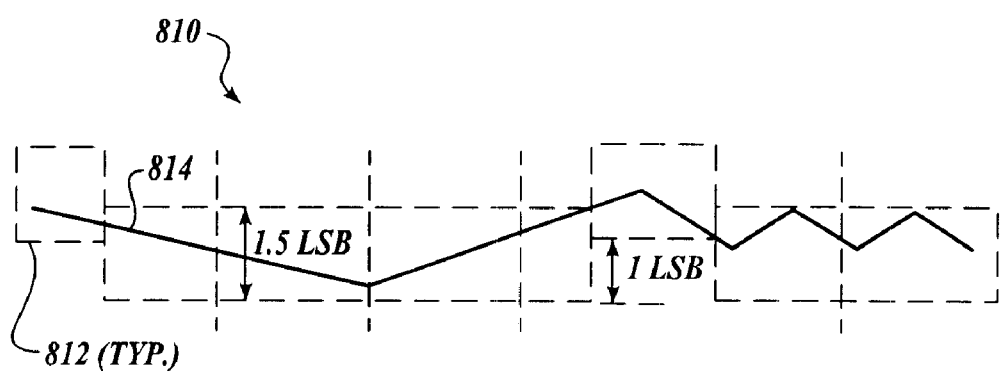
FIG. 7B is a diagram illustrating the relationship of the least significant bit and voltage signal windows generated by the present invention.

FIG. 7B shows an overview 810 of several consecutive voltage signal windows 812 as the present invention adjusts the position of each successive window to track/follow the voltage level of an analog signal 814. In this exemplary embodiment, the width of each successive window is equal to 1.5 LSB of the digital word outputted by the n-bit counter and the position of each window is adjusted in 1.0 LSB increments.

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for converting an analog input into a digital output, comprising:
   (a) a generator that generates a top voltage boundary and a bottom voltage boundary for a voltage window;
   (b) a comparator that compares the analog input to the top voltage boundary and the bottom voltage boundary for the voltage window, the comparator setting an off state when the analog signal is positioned above the bottom voltage boundary and below the top voltage boundary, the comparator setting an on state when the bottom voltage boundary is greater than the analog input and setting another on state when the top voltage is less than the analog input; and
   (c) a counter that increments a digital output when the comparator is set in the on state and decrements the digital output when the comparator is set in the other on state, the digital output of the counter representing the value of the analog signal when the comparator is set in the off state.

2. The apparatus in claim 1, wherein the counter further comprises an oscillator that generates a control signal that controls the speed that the counter will increment and decrement the digital output.

3. The apparatus in claim 2, wherein the oscillator is disabled when the comparator is in the off state, whereby power consumption of the apparatus is reduced.

4. The apparatus of claim 2, wherein the speed of the counter is slower than the speed that the comparator requires for comparing the analog input to the top voltage boundary and the bottom voltage boundary and setting the state of the comparator in accordance with the comparisons.

5. The apparatus of claim 1, further comprising a feed back loop that provides the digital output of the counter to the generator.

6. The apparatus of claim 1, wherein the top voltage boundary and the bottom voltage boundary are equivalently increased when the counter increments the digital output and equivalently decreased when the counter decrements the digital output.

7. The apparatus of claim 6, wherein a new voltage window is generated at a higher position when the counter is incremented and another new voltage window is generated at a lower position when the counter is decremented, wherein hysteresis is created by the overlap between the bounds of consecutively generated voltage windows.

8. The apparatus of claim 7, wherein the distance and the other distance are proportional to a constant multiplier of the least significant bit (LSB) of the digital output and less than the height of the voltage window.

9. The apparatus of claim 6, further comprising an absolute upper limit for incrementing the top voltage boundary and an absolute lower limit for decrementing the bottom voltage boundary for the voltage window.

10. The apparatus of claim 1, wherein the generator includes a plurality of current sources arranged in an array, each current source being separately controlled by a particular bit in the digital output of the counter.

11. The apparatus of claim 10, wherein the generator includes a resistive ladder that is coupled to a plurality of switches that are separately coupled to a corresponding current source in the array.

12. The apparatus of claim 11, wherein the type of the plurality of switches include an electronic switch and relay.

13. The apparatus of claim 9, wherein the current sources are matched.

14. The apparatus of claim 9, wherein the current sources are scaled.

15. An apparatus for converting an analog input into a digital output, comprising:
   (a) means for generating a top voltage boundary and a bottom voltage boundary for a voltage window;
   (b) means for comparing the analog input to the top voltage boundary and the bottom voltage boundary for the voltage window, the comparator having an off state when the analog signal is positioned above the bottom voltage boundary and below the top voltage boundary, the comparator having an on state when the bottom voltage boundary is greater than the analog input and having another on state when the top voltage boundary is less than the analog input; and
   (c) means for incrementing a digital output when the comparator is in the on state and decrementing the digital output when the comparator is in the other on state, the digital output of a counter representing the value of the analog signal when the comparator is in the off state.

16. A method for converting an analog input into a digital output, comprising:
   (a) generating a top voltage boundary and a bottom voltage boundary for a voltage window;
   (b) comparing the analog input to the top voltage boundary and the bottom voltage boundary for the voltage window, setting an off state when the analog signal is positioned above the bottom voltage boundary and below the top voltage boundary, setting an on state when the bottom voltage boundary is greater than the analog input and setting another on state when the top voltage is less than the analog input;
   (c) incrementing a digital output of a counter when the on state is set;
   (d) decrementing the digital output of the counter when the other on state is set, wherein the off state is set when the digital output of the counter represents the value of the analog signal.

17. The method of claim 16, further comprising generating a control signal that controls the speed that the counter will increment and decrement the digital output.

18. The method of claim 17, wherein the counter is disabled when the off state is set, whereby power consumption is reduced.

19. The method of claim 17, wherein the amount of time to increment or decrement the counter is greater than the amount of time required to compare the analog input to the top voltage boundary and the bottom voltage boundary and set the state in accordance with the comparisons.

20. The method of claim 16, further comprising setting an absolute upper limit for incrementing the top voltage boundary and setting an absolute lower limit for decrementing bottom voltage boundary.

* * * * *